US012706528B2

(12) United States Patent
Hayashi

(10) Patent No.: US 12,706,528 B2
(45) Date of Patent: Aug. 11, 2026

(54) POWER CONVERSION DEVICE WITH OVERLAPPING SOLID WIRING PATTERNS

(71) Applicant: Mitsubishi Electric Corporation, Tokyo (JP)

(72) Inventor: Ryoma Hayashi, Tokyo (JP)

(73) Assignee: Mitsubishi Electric Corporation, Chiyoda-ku (JP)

(*) Notice: Subject to any disclaimer, the term of this patent is extended or adjusted under 35 U.S.C. 154(b) by 476 days.

(21) Appl. No.: 18/349,326

(22) Filed: Jul. 10, 2023

(65) Prior Publication Data

US 2024/0106320 A1 Mar. 28, 2024

(30) Foreign Application Priority Data

Sep. 28, 2022 (JP) ................................ 2022-154682

(51) Int. Cl.
*H02M 7/217* (2006.01)
*H02M 1/14* (2006.01)
(Continued)

(52) U.S. Cl.
CPC ............ *H02M 1/14* (2013.01); *H02M 7/003* (2013.01); *H02M 7/05* (2021.05); *H02M 7/217* (2013.01); *H05K 1/0204* (2013.01)

(58) Field of Classification Search
CPC .......... H02M 5/40; H02M 5/42; H02M 5/453; H02M 7/7575; H02M 5/458; H02M 5/45;
(Continued)

(56) References Cited

U.S. PATENT DOCUMENTS 11,509,236 B2 * 11/2022 Hayashi ............ H02M 3/33573
2004/0257841 A1 * 12/2004 Taguchi ................ H02M 7/003 363/40

(Continued)

FOREIGN PATENT DOCUMENTS

JP 6-112657 A 4/1994
JP 2013-126360 A 6/2013

(Continued)

OTHER PUBLICATIONS

Japanese Office Action dated Aug. 19, 2025, issued in Japanese application No. 2022-154682.

(Continued)

*Primary Examiner* — Crystal L Hammond
*Assistant Examiner* — Nusrat Quddus
(74) *Attorney, Agent, or Firm* — Sughrue Mion, PLLC

(57) ABSTRACT

A power conversion device includes a first solid pattern provided on a multi-layer wiring substrate and connected to a positive side of a first power supply, a second solid pattern provided on the multi-layer wiring substrate and connected to a negative side of the first power supply, and a third solid pattern provided on the multi-layer wiring substrate and connected to a negative side of a second power supply that is insulated from the first power supply. The first solid pattern and the third solid pattern are arranged so as to at least partially overlap in a first direction of the multi-layer wiring substrate, and the second solid pattern and the third solid pattern are arranged so as to at least partially overlap in the first direction of the multi-layer wiring substrate.

20 Claims, 6 Drawing Sheets

(51) Int. Cl.

| | |
|---|---|
| ***H02M 7/00*** | (2006.01) |
| ***H02M 7/04*** | (2006.01) |
| ***H05K 1/02*** | (2006.01) |

(58) Field of Classification Search

CPC .. H02M 5/4585; H02M 5/4505; H02M 5/451; H02M 5/452; H02M 5/447; H02M 5/456; H02M 1/12; H02M 1/4266; H02M 2001/123; H02M 3/073; H02M 3/10; H02M 3/135; H02M 3/137; H02M 3/28; H02M 3/315; H02M 3/3155; H02M 3/325; H02M 3/335; H02M 7/10; H02M 7/515; H02M 7/521; H02M 7/53; H02M 7/537; H02M 7/5383; H02M 7/538466; H02M 7/53862; H02M 7/5387; H02M 7/53871; H02M 7/53875; H02M 7/757; H02M 7/79; H02M 3/337; H02M 3/338; H02M 3/3382; H02M 3/3384; H02M 7/538; H02M 7/53806; H02M 7/53832; H02M 7/53835; H02M 7/487; H02M 7/539; H02M 7/23; H02M 7/217; H02M 7/21; H02M 7/12; H02M 7/04; H02M 7/00; H02M 1/10; H02M 3/33561; H02M 7/003; H02H 7/261; H02H 7/268; H02J 3/36; H02J 3/01; G06F 1/263; H01L 25/112; H01L 25/115; H01L 23/34; H01R 13/6675; H01R 29/00; H01R 31/065; G09G 3/20; H02K 11/046; H01F 2027/406; H05K 7/20927

See application file for complete search history.

(56) References Cited

U.S. PATENT DOCUMENTS

| | | | | |
|---|---|---|---|---|
| 2014/0368145 | A1* | 12/2014 | Miyachi ................ | H02M 7/003<br>318/400.26 |
| 2019/0393873 | A1 | 12/2019 | Watanabe et al. | |
| 2021/0075250 | A1 | 3/2021 | Sugano et al. | |
| 2024/0413740 | A1* | 12/2024 | Suzuki .................... | H02M 7/48 |

FOREIGN PATENT DOCUMENTS

| | | | |
|---|---|---|---|
| JP | 2013-219919 | A | 10/2013 |
| JP | 2016-92924 | A | 5/2016 |
| JP | 2020-5365 | A | 1/2020 |
| JP | 2021-44875 | A | 3/2021 |
| JP | 2022-90384 | A | 6/2022 |
| WO | 2020/202797 | A1 | 10/2020 |

OTHER PUBLICATIONS

Communication issued Dec. 23, 2025 in Japanese Application No. 2022-154682.

* cited by examiner

500
M
1000
403
403a
403b
402
402a
402b
401
401a
401b
DRIVER CIRCUIT
201 410
202
600
1001
800
701
702
703
800
300
101
102

Z
X, Y
600
202
800
801
900
702
701
1001
201

Z
X, Y
600
800
801
202
900
1001
201
701
702

1001
Y
X
600

1001
201

1001
800

1001
202

900
X, Y
Z
801
600
701
703
702
1001
800A
201
202
800B

POWER CONVERSION DEVICE WITH OVERLAPPING SOLID WIRING PATTERNS

BACKGROUND OF THE INVENTION

1. Field of the Invention

The present disclosure relates to a power conversion device.

2. Description of the Background Art

To reduce noise generated by a power conversion device, generally, an across-the-line capacitor (hereinafter, referred to as X capacitor) is mounted as a measure against normal mode (differential mode) noise, and further, a line capacitor (referred to as Y capacitor) is mounted as a measure against common mode noise.

As conventional art, it is disclosed that a Y capacitor formed by interposing an insulator between a P conductor and an extended portion of a ground conductor equipped with a module, and another Y capacitor arranged opposite to the P conductor with respect to the extended portion of the ground conductor and formed by interposing an insulator between an N conductor and the extended portion of the ground conductor are configured as filter circuit elements.

Patent Document 1: Japanese Laid-Open Patent Publication No. 2013-219919

In a power conversion device according to Patent Document 1, in order to form a Y capacitor, bus bars on both of positive electrode and negative electrode are extended, and furthermore, an insulator is needed. Thus a problem of increasing the size and cost of the power conversion device occurs.

As the Y capacitor, it is also conceivable that a laminated ceramic capacitor is mounted on a multi-layer wiring substrate. However, in that case, the number of components is increased. Thus a problem of increasing the size and cost of the power conversion device occurs.

SUMMARY OF THE INVENTION

The present disclosure has been made to solve the above problem, and an object of the present disclosure is to reduce the size of a power conversion device and reduce cost, while effectively suppressing noise.

A power conversion device according to the present disclosure converts power of a first power supply by a plurality of switching elements and includes a multi-layer wiring substrate. The power conversion device includes a first solid pattern provided on the multi-layer wiring substrate and connected to a positive side of the first power supply, a second solid pattern provided on the multi-layer wiring substrate and connected to a negative side of the first power supply, and a third solid pattern provided on the multi-layer wiring substrate and connected to a negative side of a second power supply that is insulated from the first power supply. The first solid pattern and the third solid pattern are arranged so as to at least partially overlap in a first direction of the multi-layer wiring substrate, and the second solid pattern and the third solid pattern are arranged so as to at least partially overlap in the first direction of the multi-layer wiring substrate.

In the power conversion device according to the present disclosure, the device size is reduced and, further, cost is reduced, while effectively suppressing noise.

DETAILED DESCRIPTION OF THE PREFERRED EMBODIMENTS OF THE INVENTION

First Embodiment

The present embodiment relates to a power conversion device and, for example, relates to a filter for reducing noise in the power conversion device mounted on an electrified vehicle.

Figure 1:
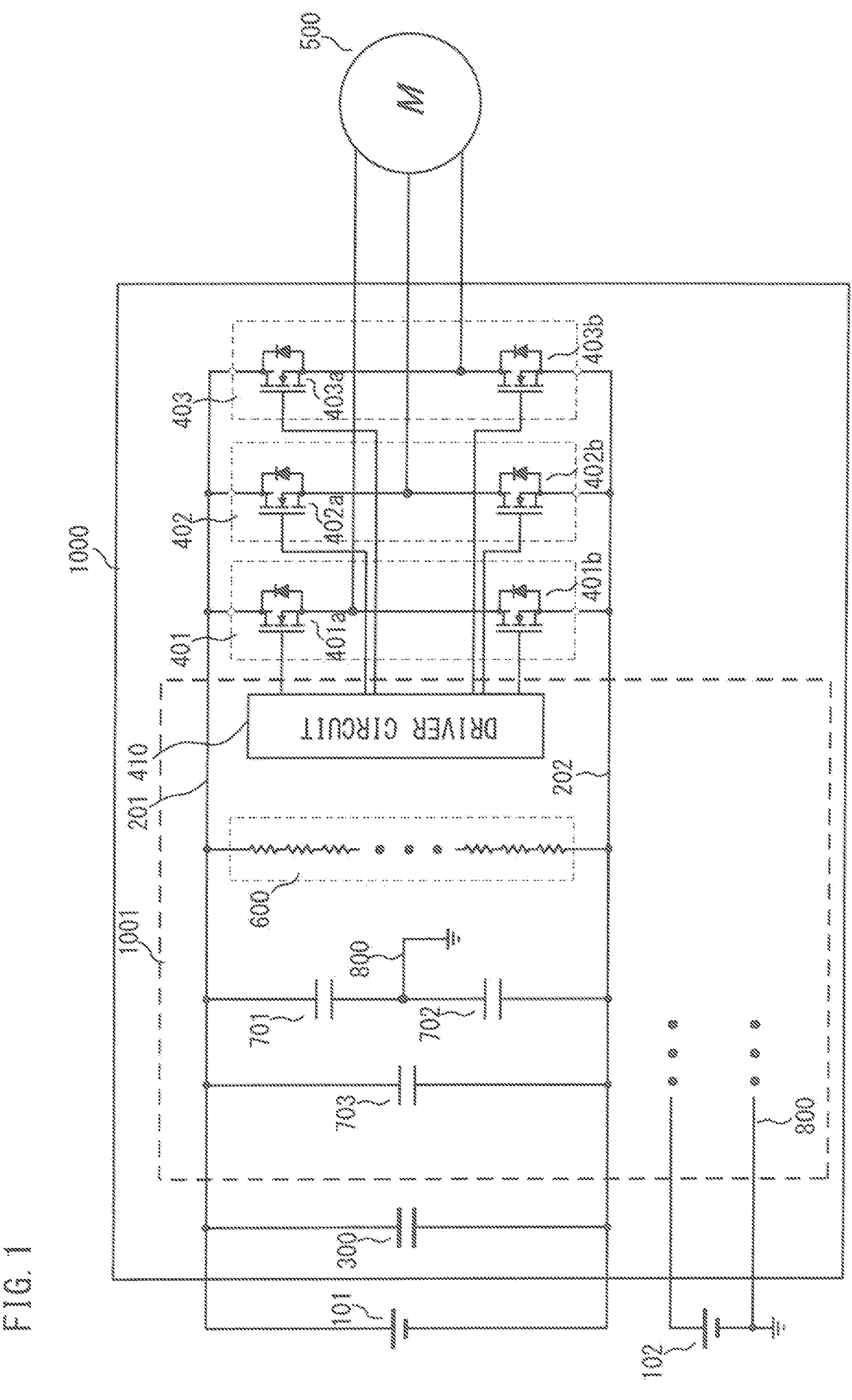
FIG. 1 is a circuit diagram showing a configuration of a power conversion device according to the first embodiment.

FIG. 1 is a circuit diagram showing a configuration of the power conversion device according to the first embodiment. As shown in FIG. 1, a power conversion device 1000 is formed by components from a DC power supply 101 to a three-phase AC motor 500, and a multi-layer wiring substrate 1001 including some of the components. The DC power supply (first power supply) 101 is connected to a smoothing capacitor 300 via a positive side wiring 201 and a negative side wiring 202. At a stage subsequent to the smoothing capacitor 300, a three-phase inverter circuit composed of a U-phase arm 401 in which switching elements 401*a*, 401*b* are connected in series, a V-phase arm 402 in which switching elements 402*a*, 402*b* are connected in series, and a W-phase arm 403 in which switching elements 403*a*, 403*b* are connected in series, is connected. At a stage subsequent to the three-phase inverter circuit, the three-phase AC motor 500 is connected. The switching elements 401*a* to 403*b* of the U-phase arm 401 to W-phase arm 403 are ON/OFF controlled in a predetermined order to generate three-phase AC current and to drive the three-phase AC motor 500.

The multi-layer wiring substrate 1001 is one of the components that form the power conversion device 1000, and is a necessary substrate in order to operate or support the power conversion device 1000. A DC power supply (second power supply) 102 insulated from the DC power supply 101 is connected to the multi-layer wiring substrate 1001. In addition, a plurality of power supplies produced by the power supply 102, for example, a power supply for a microcomputer which controls power conversion of the power conversion device, a power supply for a current sensor, and further a power supply for driving a driver circuit 410, are mounted on the multi-layer wiring substrate 1001. The driver circuit 410 which is necessary in order to drive the switching elements 401*a* to 403*b*, and the other circuits such as a voltage sensor and a current sensor are also mounted on the multi-layer wiring substrate 1001. A negative side of the DC power supply 102 is grounded to form a GND (ground) potential of the power conversion device 1000.

As the switching elements 401*a* to 403*b*, an insulated gate bipolar transistor (IGBT), a metal-oxide-semiconductor field-effect transistor (MOSFET), or the like is used. FIG. 1 shows an example in which the MOSFET is used.

Electric charge is accumulated in the smoothing capacitor 300 while the power conversion device 1000 is in operation, and thus the smoothing capacitor 300 has electric charge accumulated therein even when the power conversion device 1000 is not in operation. A discharge resistor 600 discharges electric charge accumulated in the smoothing capacitor 300 so as not to cause malfunction due to the accumulated electric charge when the power conversion device 1000 is not in operation. The discharge resistor 600 is connected in parallel to the smoothing capacitor 300.

A Y capacitor 701 on a positive side is arranged between the positive side wiring 201 connected to a positive side of the DC power supply 101 and a GND wiring 800 connected to the negative side of the DC power supply 102. In addition, a Y capacitor 702 on the negative side is arranged between the negative side wiring 202 connected to the negative side of the DC power supply 101 and the GND wiring 800. As a measure against common mode noise among noise generated by switching of the switching elements 401*a* to 403*b*, the Y capacitors 701, 702 is effective and has an effect as a noise filter in order to reduce noise.

In addition, an X capacitor 703 is arranged between the positive side wiring 201 and the negative side wiring 202. As a measure against normal mode noise among noise generated by switching of the switching elements 401*a* to 403*b*, the X capacitor 703 is effective and has an effect as a noise filter in order to reduce noise.

Normal mode noise is transmitted in a mode in which noise returns from a plus side of the power supply through a minus side to a noise source and such a mode is referred to as differential mode. On the other hand, common mode noise is transmitted in a mode in which noises having the same phase advance in the same direction on both of the plus side and the minus side of the power supply and return through the GND to the noise source.

Figure 2:
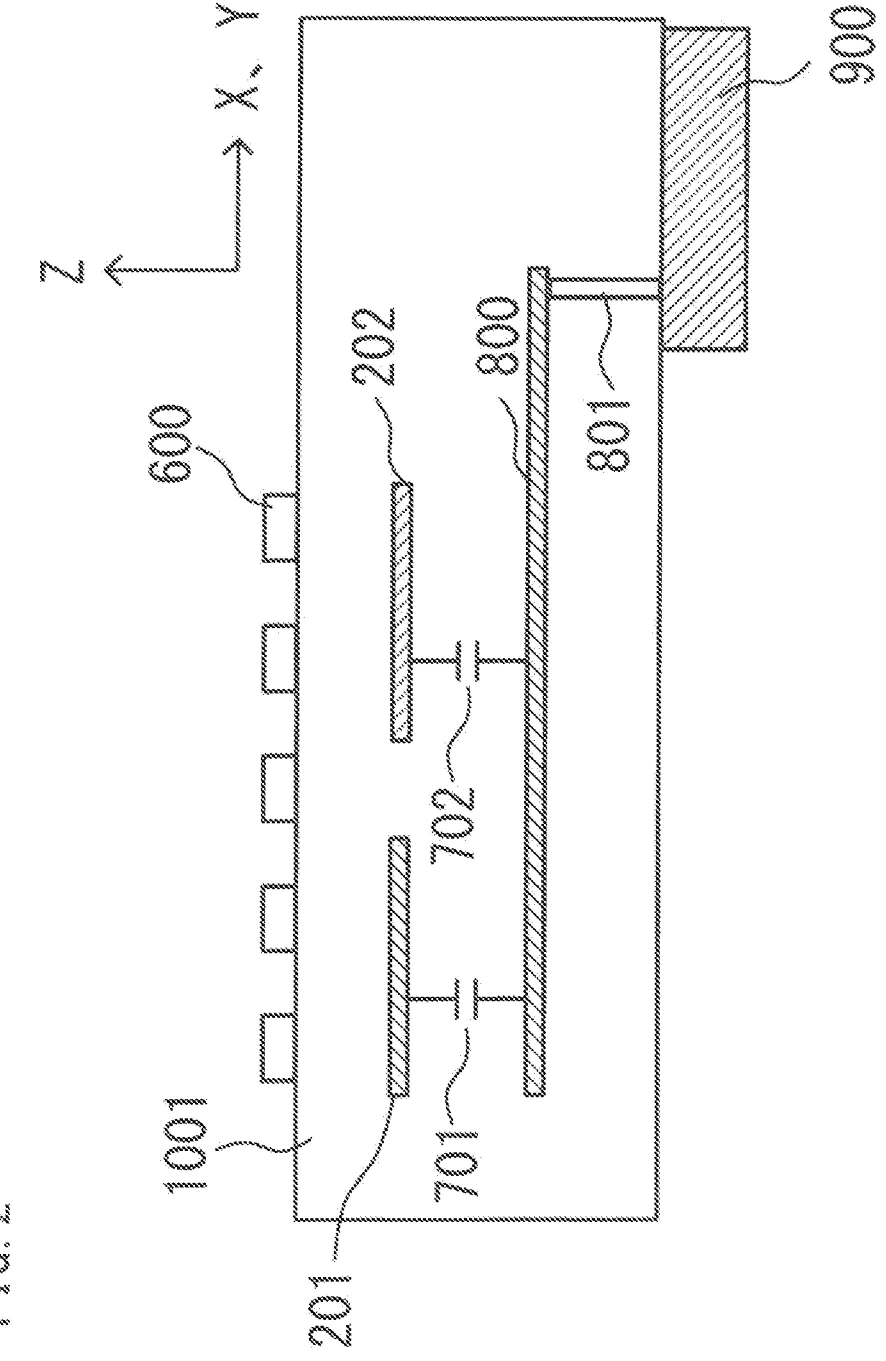
FIG. 2 is a side sectional view showing a multi-layer wiring substrate portion of the power conversion device according to the first embodiment.
Figure 3A:
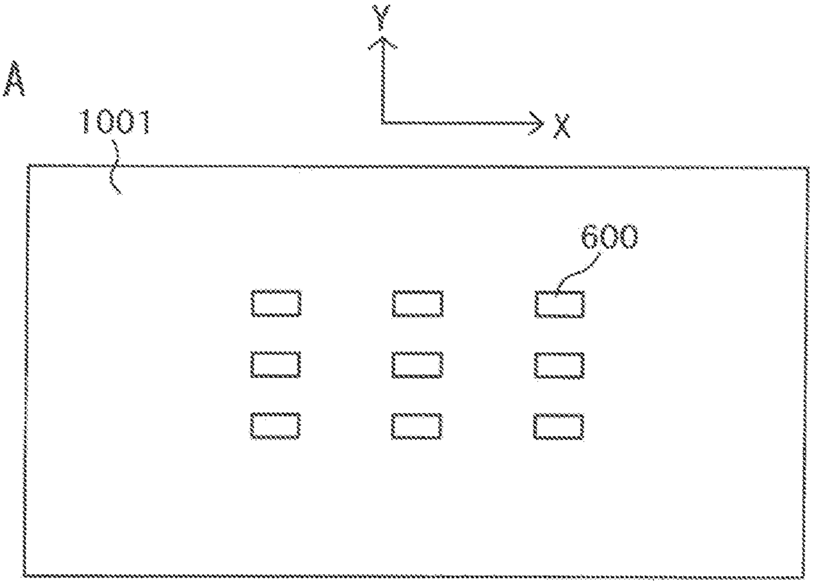
FIGS. 3A to 3C are plane views showing the multi-layer wiring substrate portion of the power conversion device according to the first embodiment.
Figure 3B:
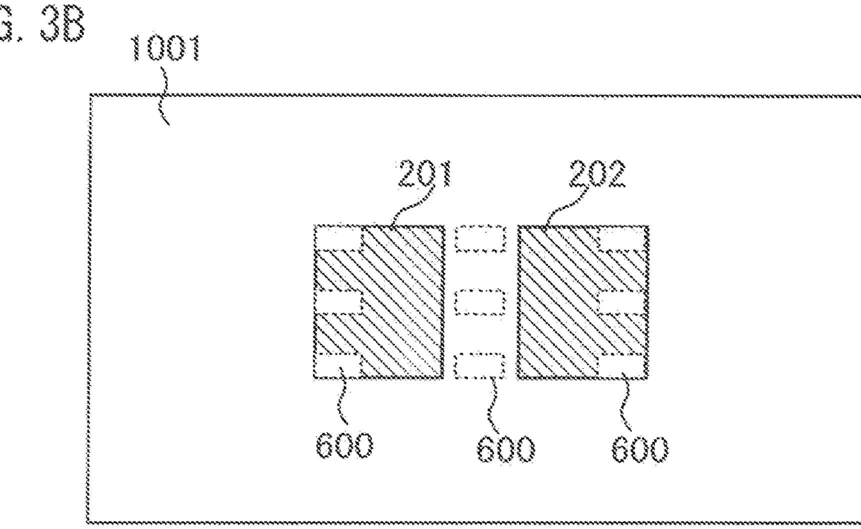
Figure 3C:
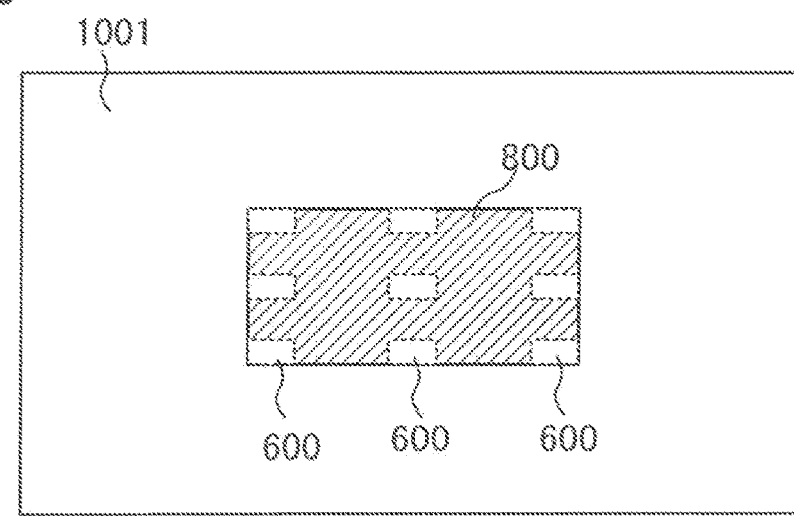

FIG. 2 is a side sectional view showing a multi-layer wiring substrate portion according to the first embodiment, FIGS. 3A to 3C are plane views showing the multi-layer wiring substrate portion according to the first embodiment, FIG. 3A is the plane view showing a first wiring layer (surface layer), FIG. 3B is the plane view showing a second wiring layer, and FIG. 3C is the plane view showing a third wiring layer. In FIG. 2, it is defined that Z direction is a substrate thickness direction (referred to as first direction), the upper side in the substrate thickness direction is the upper side in the first direction, and the lower side in the substrate thickness direction is the lower side in the first direction. In FIG. 2 and FIGS. 3A to 3C, X, Y directions each indicate a substrate horizontal plane direction (referred to as second direction).

A plurality of components are mounted on the multi-layer wiring substrate 1001, and some of them are components that generate heat by operation or the like of the power conversion device 1000. FIG. 2 and FIGS. 3A to 3C illustrate the discharge resistors as heat generating components 600, but a surface-mounted type semiconductor switching element, an integrated circuit (IC), and a reactor of a transformer or the like are conceivable as the heat generating component 600 other than the discharge resistor.

In wiring layers positioned directly below at least some of the heat generating components 600, that is, on the lower side in the first direction, a positive side solid pattern (positive side wiring, first solid pattern) 201 and a GND solid pattern (GND wiring, third solid pattern) 800 are arranged so as to at least partially overlap each other, as seen from the substrate thickness direction (first direction) of the multi-layer wiring substrate 1001. In addition, a negative side solid pattern (negative side wiring, second solid pattern) 202 and the GND solid pattern (GND wiring, third solid pattern) 800 are arranged so as to at least partially overlap each other, as seen from the substrate thickness direction (first direction) of the multi-layer wiring substrate 1001. In FIG. 3B and FIG. 3C, parts indicated by dotted lines respectively show parts positioned directly below the heat generating components 600, on the lower side in the first direction.

When layers having different patterns overlap each other as seen from the substrate thickness direction (first direction) of the multi-layer wiring substrate 1001, a capacitance component (parasitic capacitance) is produced and its capacitance value can be calculated by the following formula (1), where C: parasitic capacitance [F], $\varepsilon_r$: relative permittivity, $\varepsilon_0$: vacuum permittivity [F/m], S: pattern overlapping area [$m^2$], and d: distance between patterns [m].

$$C=\varepsilon_r\times\varepsilon_0\times S/d \tag{1}$$

As indicated by the formula (1), the positive side solid pattern 201 and the GND solid pattern 800 or the negative side solid pattern 202 and the GND solid pattern 800 are wired so as to at least partially overlap each other, as seen from the substrate thickness direction (first direction) of the multi-layer wiring substrate 1001. Thereby the capacitances of the Y capacitor 701 and the Y capacitor 702 are respectively produced.

According to the configuration of the power conversion device 1000 of the present embodiment, in the multi-layer wiring substrate 1001 indispensable to the power conversion device 1000, a noise filter effective against common mode noise can be provided without adding any element such as a laminated ceramic capacitor, while effectively utilizing a space on the lower side in the first direction of the heat generating components 600 mounted on the multi-layer wiring substrate 1001. Therefore, a small-sized, inexpensive power conversion device 1000 can be provided.

Next, it will be described that a permittivity $\varepsilon(\varepsilon_r\times\varepsilon_0)$ of a material forming the multi-layer wiring substrate 1001 has a positive gradient. An example of the material whose permittivity has a positive gradient with respect to temperature rise is, for example, a glass epoxy substrate (FR-4). The heat generating components 600 mounted on the multi-layer wiring substrate 1001 raise the temperature of the wiring layer positioned directly below the heat generating components 600, and the permittivity is also increased. According to the formula (1), when the permittivity ε is increased, the parasitic capacitance C produced by the pattern is also increased. Thereby the Y capacitors 701, 702 can be formed more effectively.

As described above, the Y capacitor is formed as the parasitic capacitance to be produced by the solid pattern while effectively utilizing the wiring layer positioned directly below the heat generating components of the multi-layer wiring substrate. Thus a small-sized, inexpensive power conversion device can be provided while suppressing common mode noise.

Second Embodiment

Figure 4:
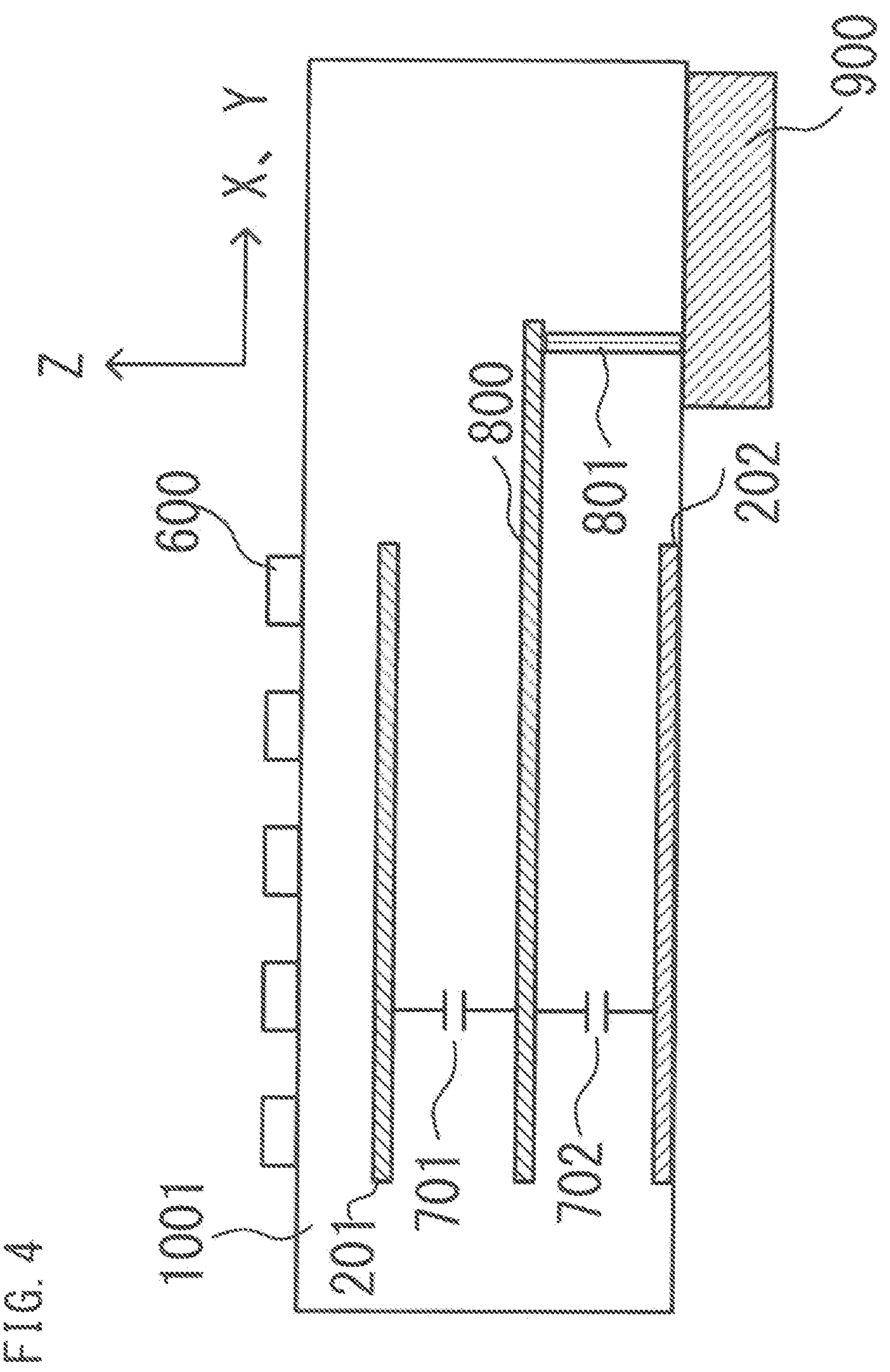
FIG. 4 is a side sectional view showing a multi-layer wiring substrate portion of a power conversion device according to the second embodiment.
Figure 5A:
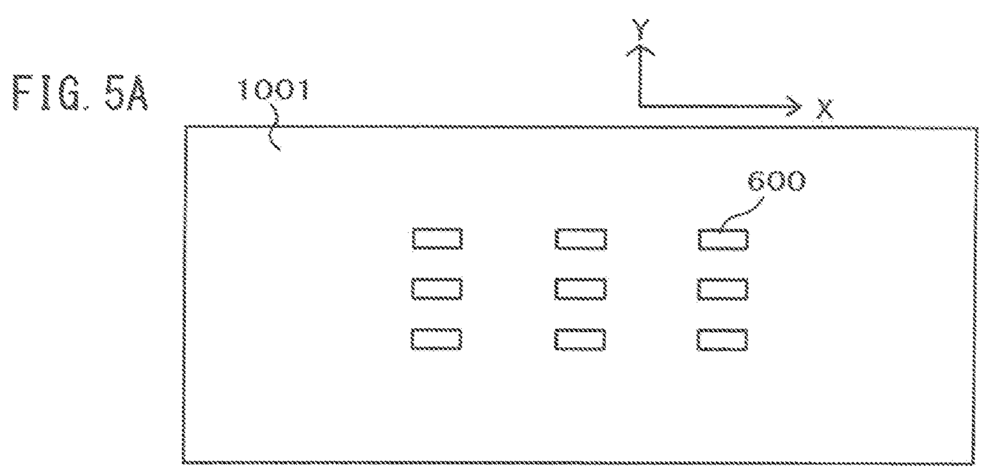
FIGS. 5A to 5D are plane views showing the multi-layer wiring substrate portion of the power conversion device according to the second embodiment.
Figure 5B:
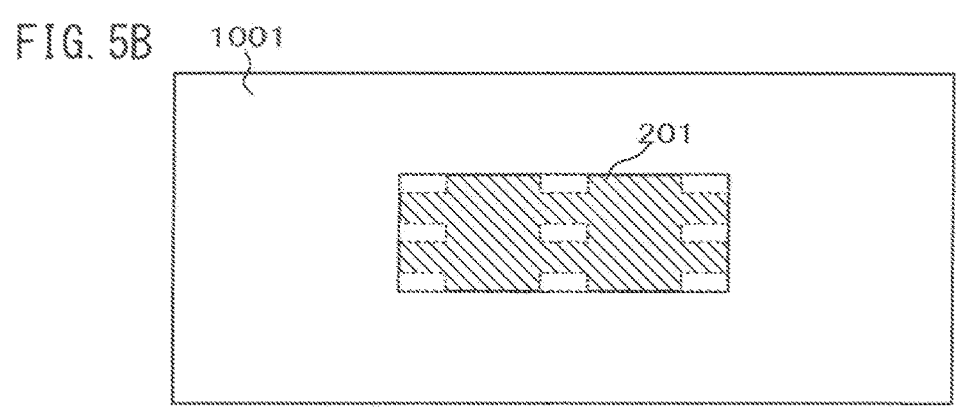
Figure 5C:
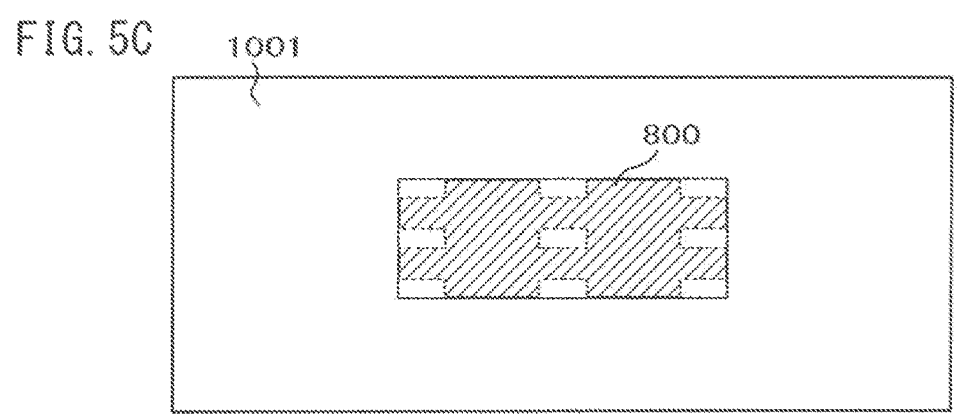
Figure 5D:
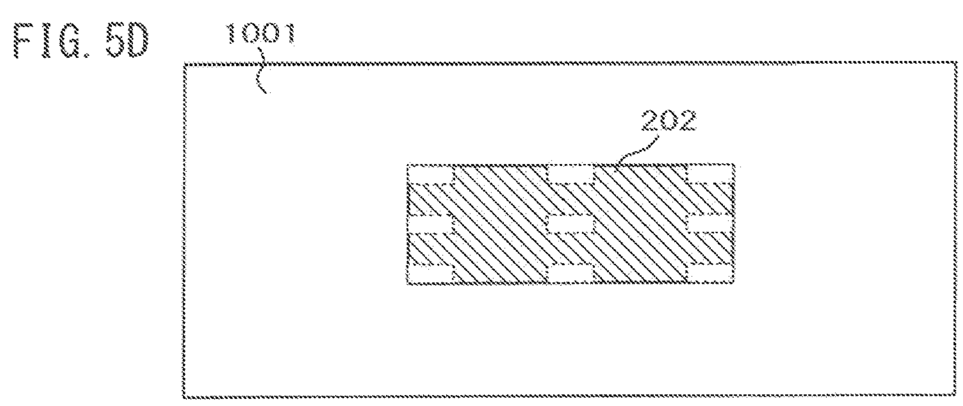

FIG. 4 is a side sectional view showing a multi-layer wiring substrate portion according to the second embodiment, FIGS. 5A to 5D are plane views showing the multi-layer wiring substrate portion according to the second embodiment, FIG. 5A is the plane view showing a first wiring layer (surface layer), FIG. 5B is the plane view showing a second wiring layer, FIG. 5C is the plane view showing a third wiring layer, and FIG. 5D is the plane view showing a fourth wiring layer.

In FIG. 4 and FIGS. 5A to 5D, the positive side solid pattern 201 and the negative side solid pattern 202 are wired on separate wiring layers.

In FIG. 2 and FIGS. 3A to 3C, the positive side solid pattern 201 and the negative side solid pattern 202 are wired on the same wiring layer. In this case, it is required to provide an insulation distance between the patterns in the substrate horizontal plane direction (second direction). When the insulation distance is provided, pattern areas of the positive side solid pattern 201 and the negative side solid pattern 202 are reduced. On the other hand, in the second embodiment, the positive side solid pattern 201 and the negative side solid pattern 202 are wired on separate wiring layers, and thus it is required to provide the insulation distance between the patterns in the substrate horizontal plane direction (second direction). Accordingly, the positive side solid pattern 201 and the negative side solid pattern 202 can be more widely installed. According to the formula (1), when the pattern area S is increased, the parasitic capacitance C to be obtained is also increased. Thereby the Y capacitors 701, 702 can be more effectively formed. In FIG. 4, the positions of the positive side solid pattern 201 and the negative side solid pattern 202 appear to completely match each other as seen from the upper side in the first direction. But it is not required to completely match each other.

Next, as shown in FIG. 4, an effect of wiring the GND solid pattern 800 between the positive side solid pattern 201 and the negative side solid pattern 202 will be described.

For example, it is assumed that the positive side solid pattern 201, the negative side solid pattern 202, and the GND solid pattern 800 are arranged in this order from the upper side in the first direction, and wired on separate wiring layers. In order to form the Y capacitor 701 on the positive side, while the positive side solid pattern 201 and the GND solid pattern 800 are wired so as to overlap each other, it is required to wire the positive side solid pattern 201 and the negative side solid pattern 202 so as not to overlap as seen from the first direction of the multi-layer wiring substrate 1001. Accordingly, an area in which the negative side solid pattern 202 can be wired is decreased. Thus, the capacitance value of the Y capacitor 702 on the negative side is decreased.

According to the formula (1), it is also found that the value of the parasitic capacitance C is inversely proportional to a distance d between the patterns. It is found that while a distance between the negative side solid pattern 202 and the GND solid pattern 800 is decreased, a distance between the positive side solid pattern 201 and the GND solid pattern 800 is increased, and thus the capacitance value of the Y capacitor 701 on the positive side is decreased.

On the other hand, when the GND solid pattern 800 is wired between the positive side solid pattern 201 and the negative side solid pattern 202 as shown in FIG. 4, it is not required that the positive side solid pattern 201 and the negative side solid pattern 202 are wired so as not to overlap as seen from the first direction of the multi-layer wiring substrate 1001. And the distance between the positive side solid pattern 201 and the GND solid pattern 800 is decreased, and the distance between the negative side solid pattern 202 and the GND solid pattern 800 is decreased. Thereby the parasitic capacitance C can be obtained most efficiently.

Third Embodiment

Figure 6:
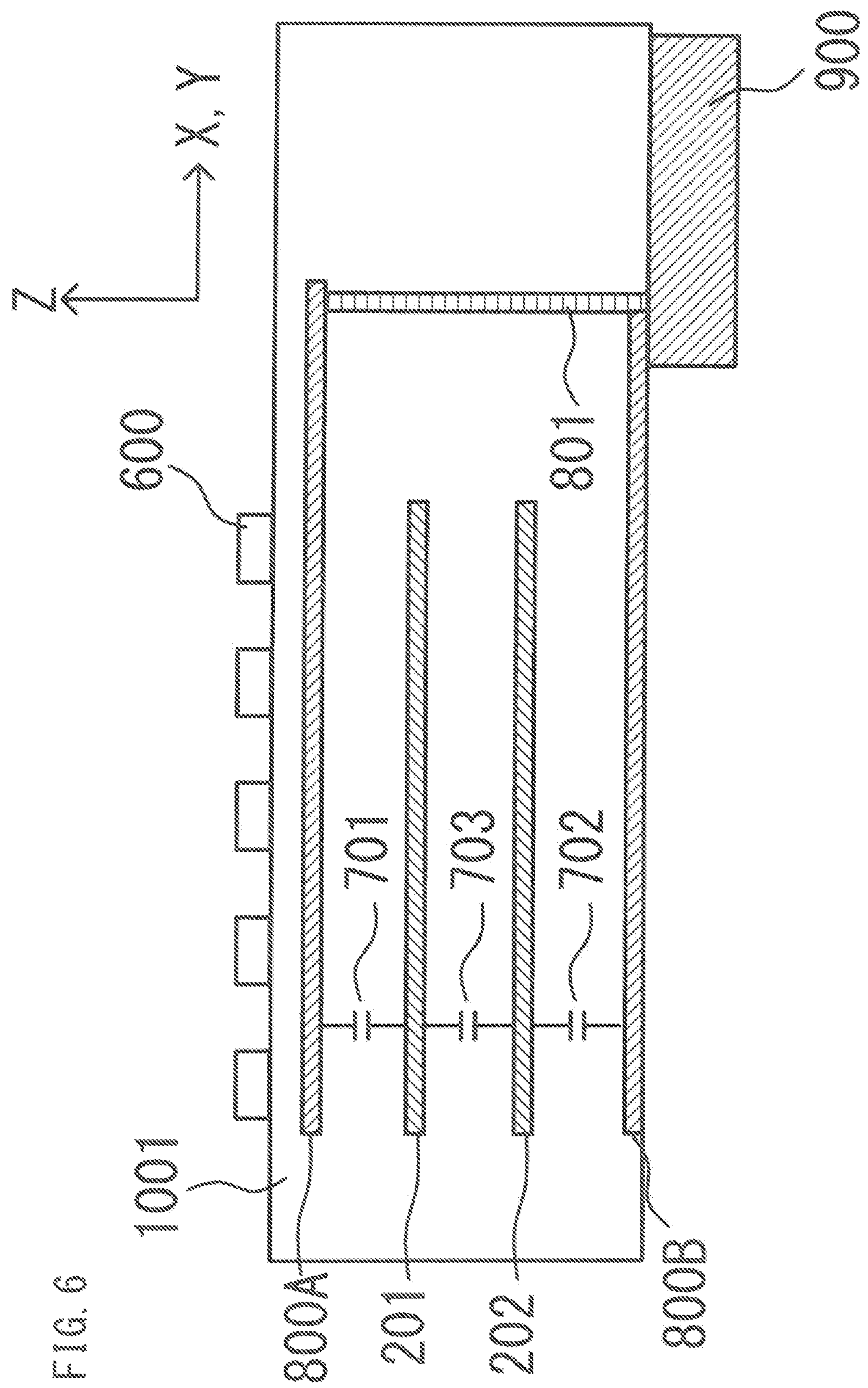
FIG. 6 is a side sectional view showing a multi-layer wiring substrate portion of a power conversion device according to the third embodiment.

FIG. 6 is a side sectional view showing a multi-layer wiring substrate portion according to the third embodiment. As shown in FIG. 6, a GND solid pattern 800A, the positive side solid pattern 201, the negative side solid pattern 202, and a GND solid pattern 800B are arranged in this order from the upper side in the first direction, and are respectively wired on separate wiring layers. The Y capacitor 701 is formed by the positive side solid pattern 201 and the GND solid pattern 800A, the Y capacitor 702 is formed by the negative side solid pattern 202 and the GND solid pattern 800B, and further, the X capacitor 703 is formed by the positive side solid pattern 201 and the negative side solid pattern 202. Accordingly, measures against both common mode noise and normal mode noise can be taken without adding any element. And size reduction and cost reduction of the power conversion device can be achieved.

The GND solid pattern 800A, the negative side solid pattern 202, the positive side solid pattern 201, and the GND solid pattern 800B may be arranged in this order, which is different from that shown in FIG. 6, from the upper side in the first direction and they are respectively wired on separate wiring layers. As described above, in the multi-layer wiring substrate 1001, the GND solid patterns 800A, 800B may be respectively arranged at the topmost layer portion and the lowermost layer portion, and the positive side solid pattern 201 and the negative side solid pattern 202 may be arranged between the two GND solid patterns 800A, 800B. Furthermore, in FIG. 6, the positions of the positive side solid pattern 201 and the negative side solid pattern 202 appear to completely match each other as seen from the upper side in the first direction. But it is not required to completely match each other. That is, the positive side solid pattern 201 and the negative side solid pattern 202 are arranged so as to at least partially overlap in the first direction of the multi-layer wiring substrate 1001 in order to form the X capacitor 703.

Next, as shown in FIG. 2, FIG. 4, and FIG. 6, the GND solid pattern 800 grounded to a housing 900 of the power conversion device 1000 will be described.

The GND solid pattern 800 is connected to a through hole 801 to be wired up to a substrate surface. The substrate surface portion of the through hole 801 is grounded to the housing 900. Since the GND solid pattern 800 is grounded to the housing 900, the impedance between the Y capacitors 701, 702 formed by the solid pattern and the housing 900 is small. Thereby noise attenuation characteristics can be improved.

The GND pattern of a substrate is generally connected to the negative side of the power supply 102 via a harness. However, when the GND pattern is connected via the harness, a path to the power supply 102 become longer, thereby impedance is increased. In that case, the housing 900 and the GND solid pattern 800 are grounded at a substrate screw fixing portion. The substrate includes a large number of substrate screw fixing portions. When the GND solid pattern 800 is grounded at the screw fixing portion close to the GND solid pattern 800 to be grounded, the path is shorter than that via the harness, thus the impedance between the Y capacitors 701, 702 and the housing 900 is small.

When the path to the GND is long, a value of self-inductance is unnecessarily added to the Y capacitors 701, 702, their characteristics are deteriorated. Thus desired attenuation characteristics cannot be obtained. On the other hand, when the path to the GND is shortened in order to suppress the value of self-inductance, desired attenuation characteristics of the Y capacitor can be obtained. Thereby attenuation characteristics of the noise filter can be improved.

The above configuration can save the areas necessary for the positive side solid pattern 201, the negative side solid pattern 202, and the GND solid pattern 800. As a result, size reduction and cost reduction of the power conversion device 1000 are achieved.

Next, an effect obtained when the heat generating component is the discharge resistor 600 will be described.

As shown in the formula (2), loss is generated in the discharge resistor 600.

$$P=V^2/R \tag{2}$$

In a conventional electrified vehicle, the battery voltage for driving a motor is, for example, 400 V to 800 V, and the same voltage is also applied to the smoothing capacitor 300. According to the formula (2), the higher the voltage is, the larger the loss to be generated in the discharge resistor 600 is. To smoothly perform discharge via the discharge resistors 600 without failure, a large number of chip resistors are, for example, connected in series or in parallel with each other in order to form a discharge circuit. Thereby it is able to reduce loss per resistor and to smoothly discharge without failure.

Since a plurality of the chip resistors are arranged, the mounting area is larger than that of a surface-mounted type semiconductor switching element, an integrated circuit (IC), or a reactor of a transformer or the like. The larger the mounting area of the heat generating components (discharge resistors 600) is, the larger the area of the wiring layer directly below the heat generating components is. Accordingly, the areas of the positive side solid pattern 201, the negative side solid pattern 202, and the GND solid pattern 800 can be enlarged. According to the formula (1), the larger the pattern area S is, the larger the parasitic capacitance C to be obtained is. Thereby it is able that Y capacitors 701, 702 are more effectively formed.

In addition, the higher the voltage of the DC power supply 101 is, the higher the noise level to be generated from the power conversion device 1000 is. In this case, since the voltage to be applied across the discharge resistor 600 is also increased, the loss in the discharge resistor 600 is increased, and the heat generation amount is also increased. therefore the parasitic capacitance C of the Y capacitors 701, 702 is increased. That is, the higher the voltage of the DC power supply 101 is, the higher the noise level is. However, the parasitic capacitance C of the Y capacitors 701, 702 is also increased. Thus it is effective that the heat generating component is the discharge resistor 600.

Here, an example in which the discharge resistor 600 is used in order to discharge electric charge of the smoothing capacitor 300 is described. But a discharge resistor for discharging electric charge of the X capacitor 703 can be used to obtain the same effect.

In addition, the power conversion device 1000 is described as an inverter circuit in the above embodiment. But the same effect is also obtained when the power conversion device 1000 is a converter circuit.

Although the disclosure is described above in terms of various exemplary embodiments and implementations, it should be understood that the various features, aspects, and functionality described in one or more of the individual embodiments are not limited in their applicability to the particular embodiment with which they are described, but they can be applied, alone or in various combinations to one or more of the embodiments of the disclosure.

It is therefore understood that numerous modifications which have not been exemplified can be devised without departing from the technical scope of the specification of the present disclosure. For example, at least one of the constituent components may be modified, added, or eliminated. At least one of the constituent components mentioned in at least one of the preferred embodiments may be selected and combined with the constituent components mentioned in another preferred embodiment.

Hereinafter, modes of the present disclosure are summarized as additional notes.

(Additional Note 1)

A power conversion device which converts power of a first power supply by a plurality of switching elements and includes a multi-layer wiring substrate, the power conversion device including:

- a first solid pattern provided on the multi-layer wiring substrate and connected to a positive side of the first power supply;
- a second solid pattern provided on the multi-layer wiring substrate and connected to a negative side of the first power supply; and
- a third solid pattern provided on the multi-layer wiring substrate and connected to a negative side of a second power supply that is insulated from the first power supply, wherein
- the first solid pattern and the third solid pattern are arranged so as to at least partially overlap in a first direction of the multi-layer wiring substrate, and the second solid pattern and the third solid pattern are arranged so as to at least partially overlap in the first direction of the multi-layer wiring substrate.

(Additional Note 2)

The power conversion device according to additional note 1, wherein

- heat generating components are mounted on the multi-layer wiring substrate, and
- in a wiring layer positioned on the lower side in the first direction of at least some of the heat generating components,
- the first solid pattern and the third solid pattern are arranged so as to at least partially overlap in the first direction of the multi-layer wiring substrate, and the second solid pattern and the third solid pattern are arranged so as to at least partially overlap in the first direction of the multi-layer wiring substrate.

(Additional Note 3)

The power conversion device according to additional note 1 or 2, wherein a permittivity of a material forming the multi-layer wiring substrate has a positive gradient with respect to temperature rise.

(Additional Note 4)

The power conversion device according to any one of additional notes 1 to 3, wherein

- the first solid pattern and the second solid pattern are respectively arranged on separate layers in the multi-layer wiring substrate, and
- the third solid pattern is arranged between the first solid pattern and the second solid pattern.

(Additional Note 5)

The power conversion device according to any one of additional notes 1 to 4, wherein a Y capacitor is formed by the first solid pattern and the third solid pattern arranged so as to at least partially overlap in the first direction of the multi-layer wiring substrate, and another Y capacitor is formed by the second solid pattern and the third solid pattern arranged so as to at least partially overlap in the first direction of the multi-layer wiring substrate.

(Additional Note 6)

The power conversion device according to any one of additional notes 1 to 3, wherein the third solid patterns are respectively arranged at a topmost layer portion and a lowest layer portion in the first direction of the multi-layer wiring substrate, and the first solid pattern and the second solid pattern are respectively arranged on separate layers, between the third solid pattern arranged at the topmost layer portion and the third solid pattern arranged at the lowest layer portion.

(Additional Note 7)

The power conversion device according to additional note 6, wherein the first solid pattern and the second solid pattern are arranged so as to at least partially overlap in the first direction of the multi-layer wiring substrate in order to form an X capacitor.

(Additional Note 8)

The power conversion device according to any one of additional notes 1 to 7, wherein the third solid pattern is grounded to a housing of the power conversion device.

(Additional Note 9)

The power conversion device according to additional note 2, wherein a smoothing capacitor is provided between positive side and negative side of the first power supply, and the heat generating components are discharge resistors connected in parallel with the smoothing capacitor.

What is claimed is:

1. A power conversion device which converts power of a first power supply by a plurality of switching elements and includes a multi-layer wiring substrate, the power conversion device comprising:

a first solid pattern provided on the multi-layer wiring substrate and connected to a positive side of the first power supply;

a second solid pattern provided on the multi-layer wiring substrate and connected to a negative side of the first power supply; and a third solid pattern provided on the multi-layer wiring substrate and connected to a negative side of a second power supply that provides operating power for a driver circuit that drives the switching elements, the second power supply being insulated from the first power supply, wherein the first solid pattern and the third solid pattern are arranged so as to at least partially overlap in a first direction of the multi-layer wiring substrate, and the second solid pattern and the third solid pattern are arranged so as to at least partially overlap in the first direction of the multi-layer wiring substrate.

2. The power conversion device according to claim 1, wherein heat generating components are mounted on the multi-layer wiring substrate, and in a wiring layer positioned on the lower side in the first direction of at least some of the heat generating components, the first solid pattern and the third solid pattern are arranged so as to at least partially overlap in the first direction of the multi-layer wiring substrate, and the second solid pattern and the third solid pattern are arranged so as to at least partially overlap in the first direction of the multi-layer wiring substrate.

3. The power conversion device according to claim 1, wherein a permittivity of a material forming the multi-layer wiring substrate has a positive gradient with respect to temperature rise.

4. The power conversion device according to claim 1, wherein the first solid pattern and the second solid pattern are respectively arranged on separate layers in the multi-layer wiring substrate, and the third solid pattern is arranged between the first solid pattern and the second solid pattern.

5. The power conversion device according to claim 1, wherein a Y capacitor is formed by the first solid pattern and the third solid pattern arranged so as to at least partially overlap in the first direction of the multi-layer wiring substrate, and another Y capacitor is formed by the second solid pattern and the third solid pattern arranged so as to at least partially overlap in the first direction of the multi-layer wiring substrate.

6. The power conversion device according to claim 1, wherein the third solid patterns are respectively arranged at a topmost layer portion and a lowermost layer portion in the first direction of the multi-layer wiring substrate, and the first solid pattern and the second solid pattern are respectively arranged on separate layers, between the third solid pattern arranged at the topmost layer portion and the third solid pattern arranged at the lowest layer portion.

7. The power conversion device according to claim 6, wherein the first solid pattern and the second solid pattern are arranged so as to at least partially overlap in the first direction of the multi-layer wiring substrate in order to form an X capacitor.

8. The power conversion device according to claim 1, wherein the third solid pattern is grounded to a housing of the power conversion device.

9. The power conversion device according to claim 2, wherein a smoothing capacitor is provided between positive side and negative side of the first power supply, and the heat generating components are discharge resistors connected in parallel with the smoothing capacitor.

10. The power conversion device according to claim 2, wherein a permittivity of a material forming the multi-layer wiring substrate has a positive gradient with respect to temperature rise.

11. The power conversion device according to claim 2, wherein the first solid pattern and the second solid pattern are respectively arranged on separate layers in the multi-layer wiring substrate, and the third solid pattern is arranged between the first solid pattern and the second solid pattern.

12. The power conversion device according to claim 3, wherein the first solid pattern and the second solid pattern are respectively arranged on separate layers in the multi-layer wiring substrate, and the third solid pattern is arranged between the first solid pattern and the second solid pattern.

13. The power conversion device according to claim 10, wherein the first solid pattern and the second solid pattern are respectively arranged on separate layers in the multi-layer wiring substrate, and the third solid pattern is arranged between the first solid pattern and the second solid pattern.

14. The power conversion device according to claim 2, wherein a Y capacitor is formed by the first solid pattern and the third solid pattern arranged so as to at least partially overlap in the first direction of the multi-layer wiring substrate, and another Y capacitor is formed by the second solid pattern and the third solid pattern arranged so as to at least partially overlap in the first direction of the multi-layer wiring substrate.

15. The power conversion device according to claim 3, wherein a Y capacitor is formed by the first solid pattern and the third solid pattern arranged so as to at least partially overlap in the first direction of the multi-layer wiring substrate, and another Y capacitor is formed by the second solid pattern and the third solid pattern arranged so as to at least partially overlap in the first direction of the multi-layer wiring substrate.

16. The power conversion device according to claim 4, wherein a Y capacitor is formed by the first solid pattern and the third solid pattern arranged so as to at least partially overlap in the first direction of the multi-layer wiring substrate, and another Y capacitor is formed by the second solid pattern and the third solid pattern arranged so as to at least partially overlap in the first direction of the multi-layer wiring substrate.

17. The power conversion device according to claim 10, wherein a Y capacitor is formed by the first solid pattern and the third solid pattern arranged so as to at least partially overlap in the first direction of the multi-layer wiring substrate, and another Y capacitor is formed by the second solid pattern and the third solid pattern arranged so as to at least partially overlap in the first direction of the multi-layer wiring substrate.

18. The power conversion device according to claim 11, wherein a Y capacitor is formed by the first solid pattern and the third solid pattern arranged so as to at least partially overlap in the first direction of the multi-layer wiring substrate, and another Y capacitor is formed by the second solid pattern and the third solid pattern arranged so as to at least partially overlap in the first direction of the multi-layer wiring substrate.

19. The power conversion device according to claim 12, wherein a Y capacitor is formed by the first solid pattern and the third solid pattern arranged so as to at least partially overlap in the first direction of the multi-layer wiring substrate, and another Y capacitor is formed by the second solid pattern and the third solid pattern arranged so as to at least partially overlap in the first direction of the multi-layer wiring substrate.

20. The power conversion device according to claim 13, wherein a Y capacitor is formed by the first solid pattern and the third solid pattern arranged so as to at least partially overlap in the first direction of the multi-layer wiring substrate, and another Y capacitor is formed by the second solid pattern and the third solid pattern arranged so as to at least partially overlap in the first direction of the multi-layer wiring substrate.

* * * * *